United States Patent
Yoshimi (10) Patent No.: US 7,944,770 B2
(45) Date of Patent: May 17, 2011

(54) STATIC RANDOM ACCESS MEMORY SYSTEM AND CONTROL METHOD FOR STATIC RANDOM ACCESS MEMORY SYSTEM

(75) Inventor: Koichi Yoshimi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 41 days.

(21) Appl. No.: 12/042,118

(22) Filed: Mar. 4, 2008

(65) Prior Publication Data

US 2008/0225621 A1 Sep. 18, 2008

(30) Foreign Application Priority Data

Mar. 13, 2007 (JP) .................................. 2007-063432

(51) Int. Cl.
*G11C 5/14* (2006.01)
(52) U.S. Cl. ........................ 365/227; 365/226; 365/228
(58) Field of Classification Search .................. None
See application file for complete search history.

(56) References Cited

U.S. PATENT DOCUMENTS

2005/0138442 A1* 6/2005 Keller et al. ................. 713/300

OTHER PUBLICATIONS

Stefanos Kaxiras et al., "Cache Decay: Exploiting Generational Behavior to Reduce Cache Leakage Power," 28th International Symposium on Computer Architecture, Jun. 2001.

Krisztian Flautner et al., "Drowsy Caches: Simple Techniques for Reducing Leakage Power," 29th International Symposium on Computer Architecture, pp. 148-157, May 2002.
Hiroshi Kawaguchi et al., "Dynamic Leakage Cut-off Scheme for Low-Voltage SRAM's," Symposium on VLSI Circuits Digest of Technical Papers, pp. 140-141, Jun. 1998.
Reiko Komiya et al., "Dynamic Performance Optimization for Low-Leakage Caches based on Increase-Miss Density," Summer United Workshops on Parallel, Distributed and cooperative Processing, 2005.
Karthik Sankaranarayanan et al., "Profile-Based Adaptation for Cache Decay," ACM Transactions on Architecture and Code Optimization, vol. 1, No. 3, pp. 305-322, Sep. 2004.

* cited by examiner

*Primary Examiner* — Hoai V Ho
*Assistant Examiner* — James G Norman
(74) *Attorney, Agent, or Firm* — Greer, Burns & Crain, Ltd.

(57) ABSTRACT

A static random access memory system used within a microprocessor includes a static random access memory array including a plurality of static random access memories, a storage unit configured to store a context ID used in the execution of a program or a process in association with an access pattern of the plurality of static random access memories in the execution of the program or the process, a search unit configured to, every time context switching occurs, search the storage unit for an access pattern that is associated with a context ID corresponding to a context ID of a program or a process to be executed after the context switching; and a power control unit configured to cause a static random access memory to be readable and writable on the basis of the access pattern of the plurality of static random access memories found by the search unit.

18 Claims, 10 Drawing Sheets

STATIC RANDOM ACCESS MEMORY SYSTEM AND CONTROL METHOD FOR STATIC RANDOM ACCESS MEMORY SYSTEM

BACKGROUND

The present invention relates to a static random access memory system and to a control method for the static random access memory system, and more particularly, to a static random access memory system used within a microprocessor and to a control method for the static random access memory system.

For computer systems often using micro-processing units (MPUs), reducing the power consumption of a static random access memory (SRAM) custom macro within such an MPU is known as an efficient method for reducing the power consumption of the MPU.

Much research on reducing power consumption has been conducted and made public. For example, a method for reducing power consumption by managing a line of a cache memory using a counter and stopping power supply to a line that was last accessed more than a predetermined time ago is known. This method exploits the fact that temporal locality exists in program access. However, if the power supply to a line is stopped, the value of the line is lost (the value cannot be read from the line). Thus, there is a need to store the value by copying the value in a main memory or the like.

In addition, a method for reducing power consumption by applying a low voltage to a cache line when a cache memory is not used is known. In this method, power supply is performed at a level at which the cache memory can store a value, and thus the value is not lost, unlike in the above-mentioned method. The reduction in the power consumption is achieved by a simple algorithm in which a cache line periodically enters a sleep mode (drowsy mode). However, in a case where a cache line changes from the sleep mode to a normal access mode, penalty (processing for avoiding an instable operation of a system due to power activation or the like) occurs within one or two cycles. The cache line is returned to the normal access mode within one or two cycles (the power-supply voltage is increased to a normal voltage so that an SRAM can be operated with that power supply). Since a voltage is reduced to a low level such that a value can be stored, this method has drawbacks, such as variations in semiconductors (in terms of a variation in threshold voltages and a variation in the existence of a process corner) and susceptibility to noise.

In addition, a method for configuring a cache memory using a variable threshold voltage complementary metal-oxide semiconductor (VT-CMOS) and performing power control for individual cache lines is known. However, a long time is required for power activation and voltage stabilization for a line. Thus, this method has a drawback, such as a significant elongation of the time required for accessing an SRAM.

In addition, a method for reducing the power consumption of a line not being used while maintaining performance by constantly supplying power to a cache line to which access is often made is known. However, in the cache memory configuration, a power control counter and a power control circuit are provided in a tag memory portion for each of a plurality of entries. Thus, this method has a drawback, such as an increase in the circuit scale.

In addition, a method for performing program profile-based power control in accordance with a cache decay is known. In this method, the decay interval of a cache memory is changed by profiling a program. However, the value of an SRAM, power supply to which is stopped, must be stored by copying the value in a main memory or the like. Furthermore, profile information is necessary for the execution of power control.

The above-mentioned methods have been proposed in the view of "how the power consumption in an SRAM can be reduced". That is, the above-mentioned methods are based on a concept in which in order to reduce power consumption, power supply is stopped, resulting in the possible loss of data or a concept in which in order to reduce power consumption, the amount of leak current is reduced by reducing a voltage to a level such that data can be stored.

In addition, as described above, in a case where a circuit is implemented using a known method, there are two main problems.

(1) A normal power-supply voltage state must be returned from a power-supply stopped state or a low-voltage application state, and a state exhibiting a stable power supply must be reached. In recent high-frequency microprocessors, waiting for reaching a stable state wastes time.

(2) A small power-control memory element and a control circuit for the memory element must be provided for each tag entry of a cache tag in a cache SRAM, thus increasing the circuit scale.

SUMMARY

According to an aspect of an embodiment, a static random access memory system used within a microprocessor comprises a static random access memory array including a plurality of static random access memories; a storage unit configured to store a context ID used in the execution of a program or a process in association with an access pattern of the plurality of static random access memories in the execution of the program or the process; a search unit configured to, every time context switching occurs, search the storage unit for an access pattern that is associated with a context ID corresponding to a context ID of a program or a process to be executed after the context switching; and a power control unit configured to cause a static random access memory to be readable and writable on the basis of the access pattern of the plurality of static random access memories found by the search unit.

EMBODIMENTS

An SRAM system capable of reducing the power consumption without increasing the circuit scale and a control method for the SRAM system according to an embodiment of the present invention will be described.

Figure 1:
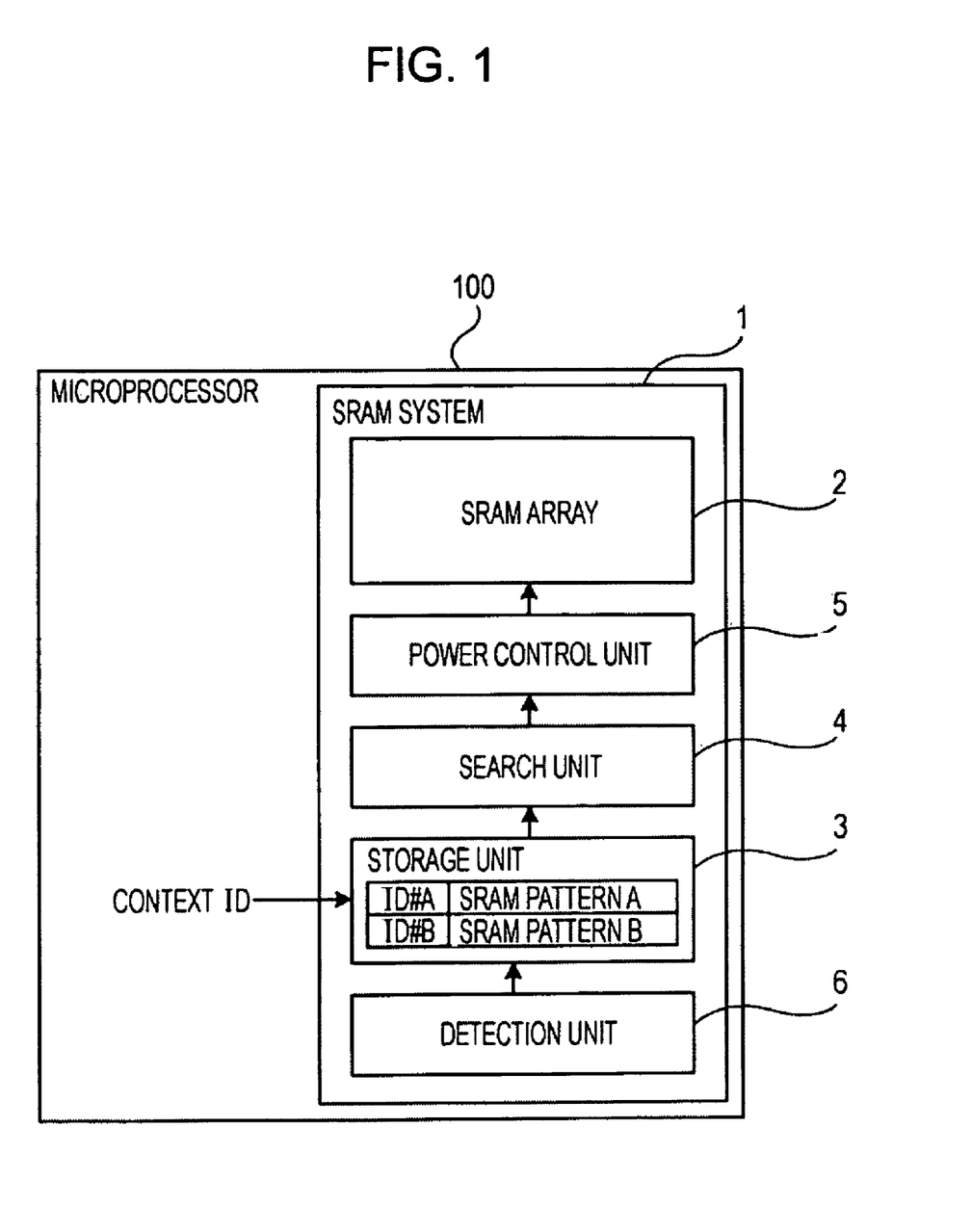
FIG. 1 schematically shows an overview of an embodiment of the present invention.

FIG. 1 schematically shows an overview of this embodiment.

An SRAM system 1 according to this embodiment is used within a microprocessor 100.

The SRAM system 1 includes an SRAM array 2, a storage unit 3, a search unit 4, and a power control unit 5.

The SRAM array 2 includes a plurality of SRAMs.

The storage unit 3 stores a context ID (CONTEXT-ID), which is used by the microprocessor 100 in the execution of a program or a process, in association with an access pattern of SRAMs in the execution of the program or the process. A context ID uniquely defines the type of context within the system. An access pattern of SRAMs indicates a physical pattern of SRAMs accessed (SRAMs to which a load instruction or a store instruction is issued) in the process. A physical SRAM macro that is actually accessed in the process can be determined by referring to the stored SRAM access pattern.

Referring to FIG. 1, an SRAM (access) pattern A is associated with a context ID: ID#A, and an SRAM (access) pattern B is associated with a context ID: ID#B.

A detection unit 6 detects an access pattern of SRAMs in the execution of a program or a process.

Every time context switching occurs, the search unit 4 searches the storage unit 3 for an SRAM access pattern that is associated with a context ID corresponding to a context ID of a program or a process to be executed after the context switching.

The power control unit 5 causes a corresponding SRAM to be readable and writable (prior to the execution of the next program or process) on the basis of the SRAM access pattern found by the search unit 4.

In the SRAM system 1 having the above-mentioned configuration, the storage unit 3 stores a context ID in association with an SRAM access pattern. Every time context switching occurs, the search unit 4 searches for an SRAM access pattern that is associated with a context ID stored in the storage unit 3. On the basis of the SRAM access pattern found by the search unit 4, the power control unit 5 causes a corresponding SRAM to be readable and writable.

Figure 2:
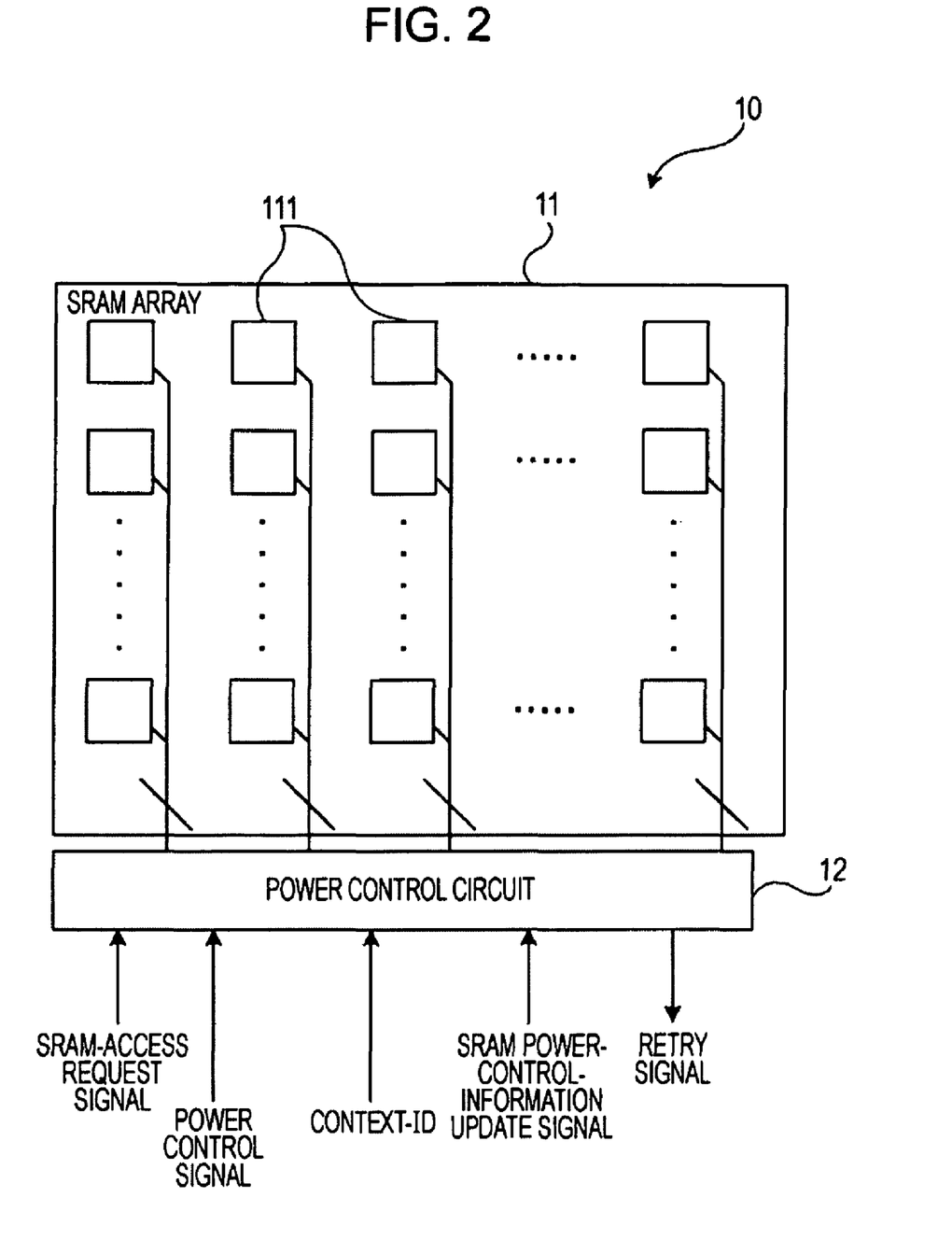
FIG. 2 is a block diagram showing an example of an SRAM system according to a first embodiment of the present invention.

FIG. 2 is a block diagram showing an SRAM system 10 according to a first embodiment of the present invention.

The SRAM system 10 is implemented in an MPU. The SRAM system 10 includes an SRAM array 11 and a power control circuit 12. The SRAM array 11 includes a plurality of cache SRAMs. The power control circuit 12 controls the SRAM array 11.

The SRAM array 11 includes M SRAMs 111 in Y rows and (Y SRAMs in the vertical direction) and X columns (X SRAMs in the horizontal direction).

The power control circuit 12 receives an SRAM-access request signal, a power control signal, a context ID, and an SRAM power-control-information update signal. The SRAM-access request signal contains an access pattern to be used when a central processing unit (CPU), which is not shown, provided in the MPU accesses a predetermined SRAM 111. The power control signal forcibly powers on an SRAM 111 that is required to be constantly powered on. The context ID is generally used as an identifier for management of a program or a process of an operating system (OS). The SRAM power-control-information update signal notifies occurrence of context switching, which is performed for switching a program or a process.

When the power control circuit 12 receives an SRAM-access request signal, if a corresponding SRAM is not powered on, the power control circuit 12 outputs a retry signal to the CPU. The retry signal causes the CPU to wait for a predetermined time required for power activation of the SRAM 111 to access the SRAM 111.

Figure 3:
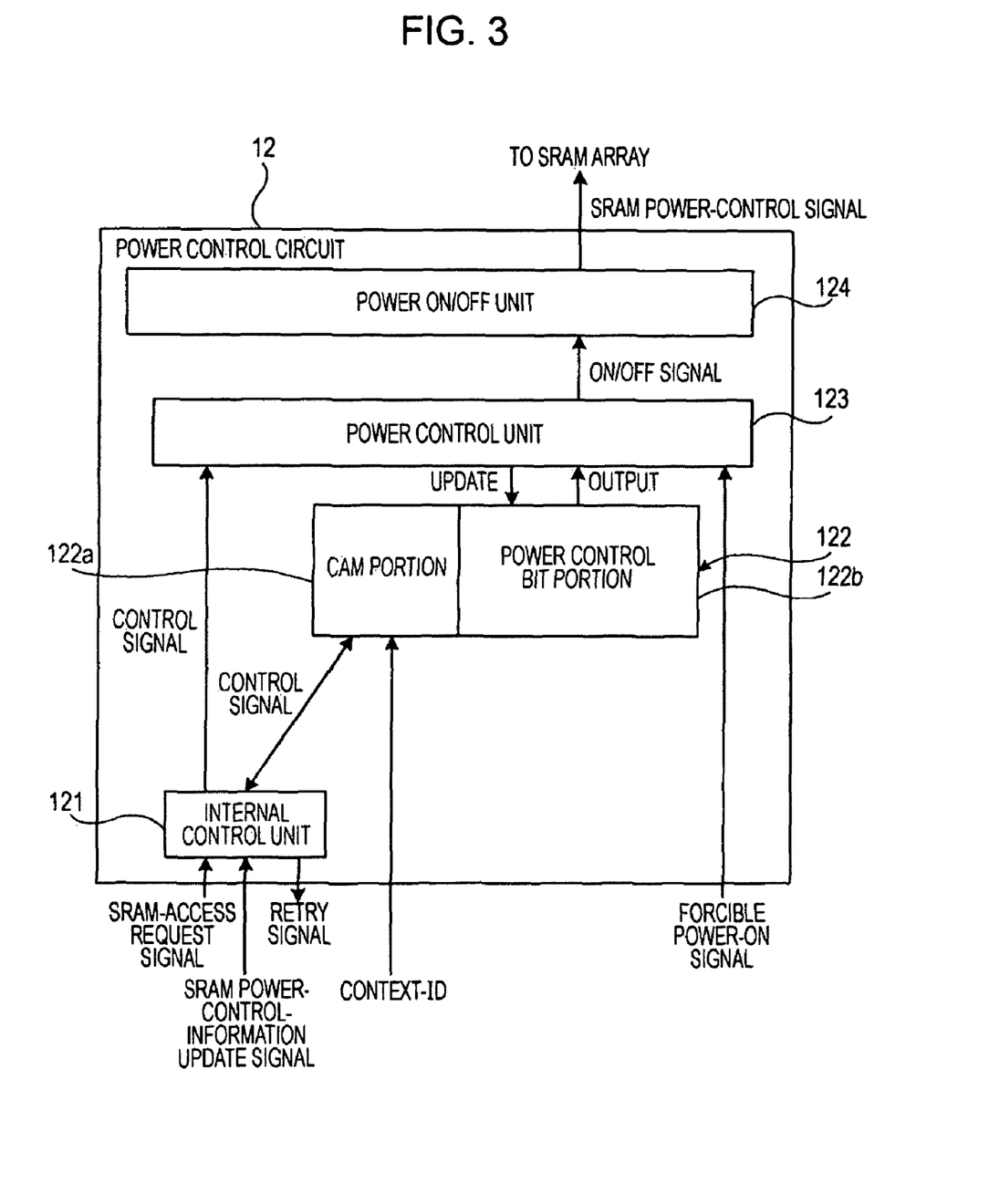
FIG. 3 is a block diagram showing a power control circuit used in the first embodiment.

FIG. 3 is a block diagram showing the power control circuit 12.

The power control circuit 12 includes an internal control unit 121, a content associative memory (CAM) 122, a power control unit 123, and a power on/off unit 124.

Upon receiving an SRAM power-control-information update signal, the internal control unit 121 outputs a control signal for updating the contents of the CAM 122.

Upon receiving an SRAM-access request signal, the internal control unit 121 outputs to the power control unit 123 a control signal for powering on a corresponding SRAM. In addition, when necessary, the internal control unit 121 outputs a retry signal to the CPU.

The CAM 122 includes a CAM portion 122a for storing a plurality of context IDs and a power control bit portion 122b for storing a bitmap (RAM power bitmap) that is associated with a context ID and that is used for controlling electric power of SRAMs.

Every time the CAM 122 receives a control signal from the internal control unit 121 (every time context switching occurs), the CAM 122 refers to the power control unit 123 and updates the contents of the CAM portion 122a and the power control bit portion 122b. At the same time, the CAM 122 acquires a context ID and outputs to the power control unit 123 a bitmap that is associated with a context ID corresponding to the acquired context ID.

Figure 4:
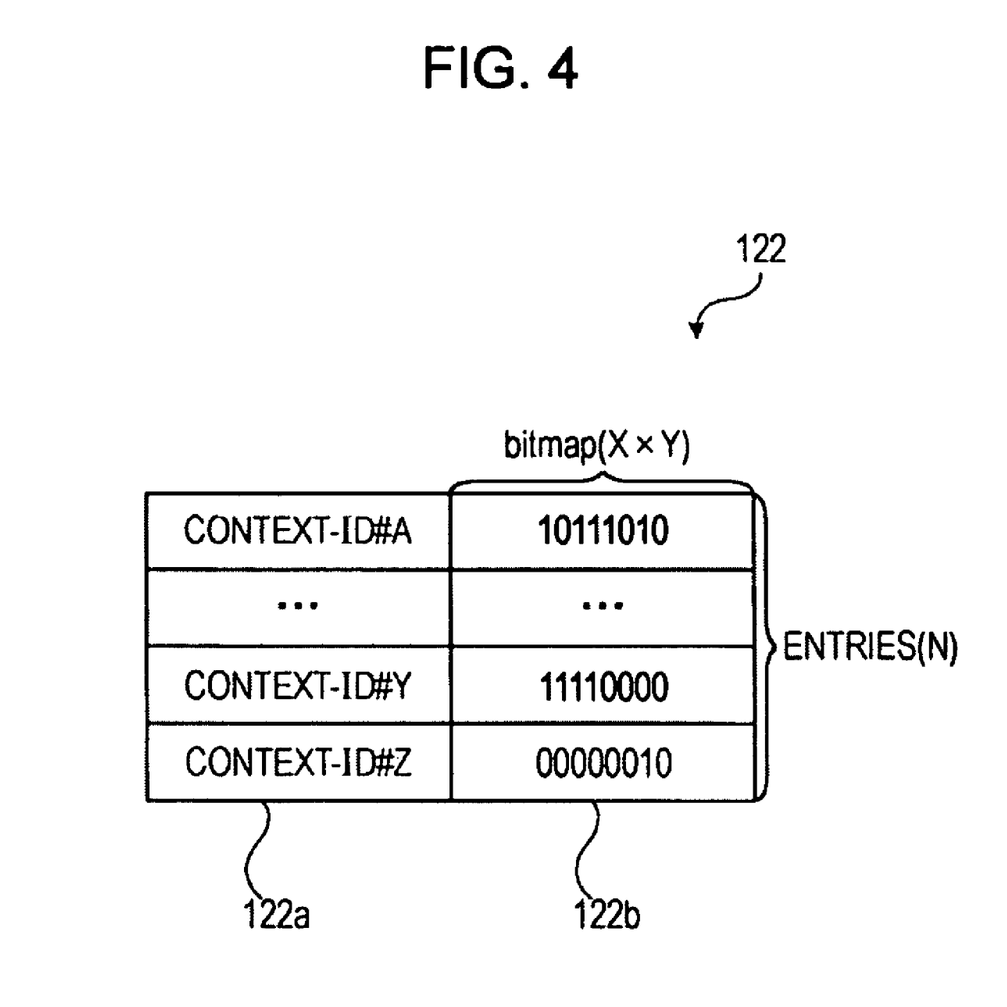
FIG. 4 shows the configuration of a content associative memory (CAM) used in the first embodiment.

FIG. 4 shows the configuration of the CAM 122.

The CAM portion 122a stores, as tags (additional information), N context IDs of programs or processes (in FIG. 4, for example, CONTEXT-ID#A, . . . , CONTEXT-ID#Y, and CONTEXT-ID#Z).

The power control bit portion 122b contains N entries. In each entry, a bitmap representing SRAMs 111 that are to be powered on prior to a process is stored as data for a corresponding context ID such that the positional relationship of the SRAMs 111 is clear. The number of bits in a bitmap is equal to the number (X×Y) of SRAMs 111. That is, in the first embodiment, each bit of the bitmap is associated with a corresponding SRAM 111. For a newly acquired context ID and a bitmap in the power control bit portion 122b, for example, the CAM 122 shown in FIG. 4 controls storing and elimination of an entry in accordance with a least recently used (LRU) method or a first-in, first-out (FIFO) method.

The description is continued with reference back to FIG. 3.

In order to store a value, the power control unit 123 adopts a power-supply control method, such as a gated VDD method, for storing the value of an SRAM.

Upon receiving a control signal from the internal control unit 121, the power control unit 123 outputs to the power on/off unit 124 a signal (hereinafter, referred to as "ON/OFF signal") for powering on SRAMs 111 to be used and causing SRAMs 111 not to be used to enter a standby state (a low-voltage state such that values of the SRAMs 111 can be stored) in accordance with an access pattern of the SRAMs 111 contained in the control signal.

In addition, upon receiving from the CAM 122 a bitmap associated with a context ID, the power control unit 123 outputs to the power on/off unit 124 an ON/OFF signal generated in accordance with information contained in the bitmap. In the case of an SRAM 111 for which both a forcible power-on signal and an ON/OFF signal are transmitted, the forcible power-on signal is prioritized.

Upon receiving an ON/OFF signal from the power control unit 123, the power on/off unit 124 generates, in accordance with the received ON/OFF signal, an SRAM power-control signal for powering on or powering off an SRAM 111.

Figure 5:
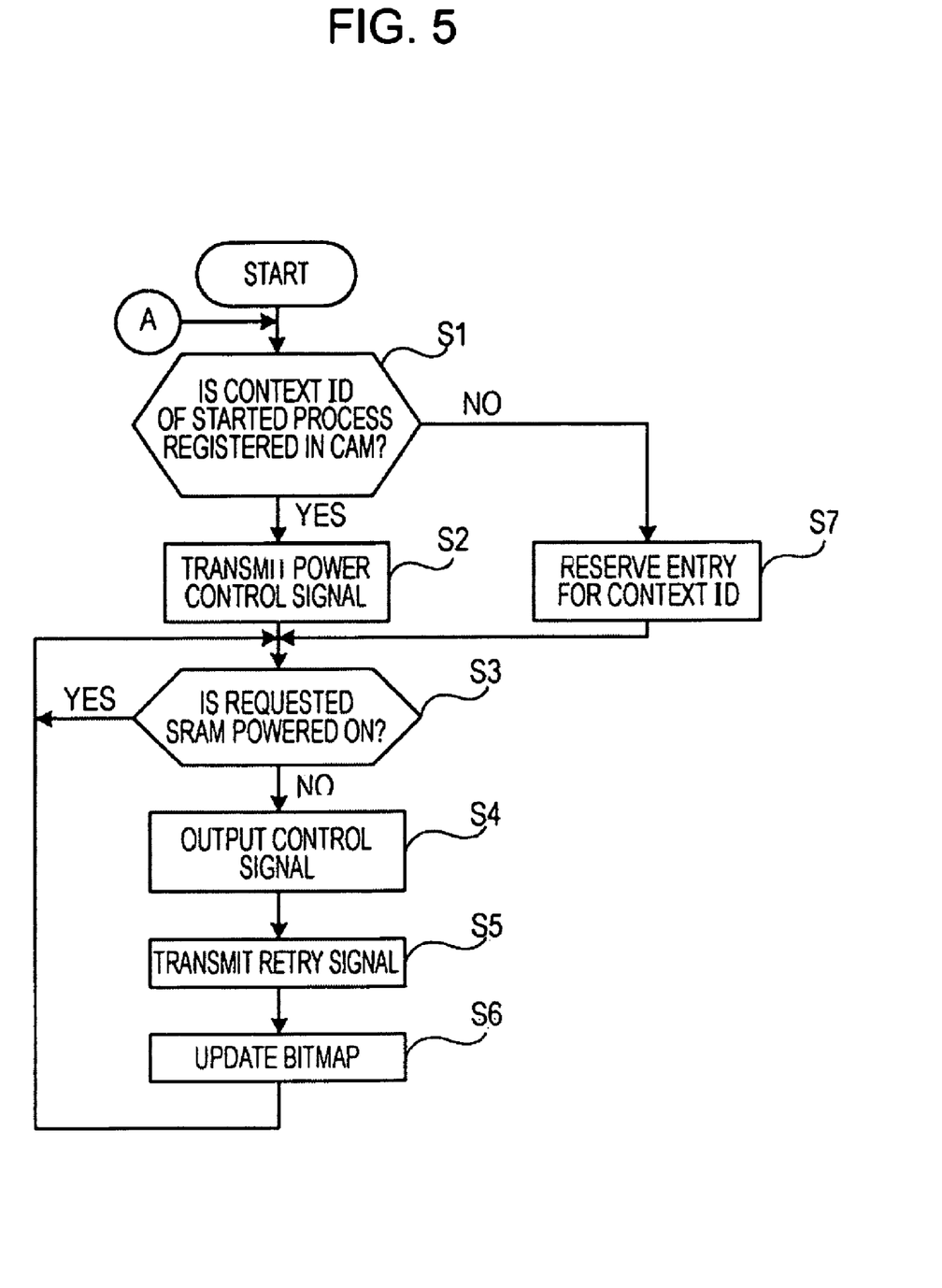
FIG. 5 is a flowchart showing an operation to be performed by the power control circuit.

FIG. 5 is a flowchart showing an operation to be performed by the power control circuit 12.

When a process is started and a corresponding context ID is input to the CAM 122, the CAM 122 determines whether the context ID is registered in the CAM 122 (step S1).

If it is determined in step S1 that the context ID is registered in the CAM 122 (if the determination in step S1 is YES), the CAM 122 transmits to the power control unit 123 a bitmap that is associated with the context ID. The power control unit 123 outputs an ON/OFF signal to the power on/off unit 124 in accordance with the bitmap. The power on/off unit 124 generates an SRAM power-control signal in accordance with the ON/OFF signal (step S2). Then, access to an SRAM 111 that is powered on is made.

Every time the internal control unit 121 receives an SRAM-access request signal, the internal control unit 121 refers to the bitmap in the power control bit portion 122b and determines whether an SRAM 111 designated (requested) by the SRAM-access request signal is powered on (step S3).

If it is determined in step S3 that the requested SRAM 111 is powered on (if the determination in step S3 is YES), the power control circuit 12 continues the operation.

If it is determined in step S3 that the requested SRAM 111 is not powered on (if the determination in step S3 is NO), the internal control unit 121 outputs to the power control unit 123 a control signal for powering on the requested SRAM 111 (step S4).

Then, the internal control unit 121 transmits a retry signal to the CPU (step S5). The CPU receives the retry signal, and waits for a predetermined time required for power activation of the SRAM 111 to access the SRAM 111. During the predetermined period of time, the internal control unit 121 transmits a control signal to the power control unit 123 and powers on the SRAM 111.

Then, the internal control unit 121 updates the bitmap based on the SRAM-access request signal transmitted in step S4 in the power control bit portion 122b (step S6).

Then, the power control circuit 12 returns to step S3 and continues the operation. With this operation, in a normal SRAM access mode, when an SRAM that is different from an SRAM that has been powered on since the SRAM was accessed in the previous execution of the process is accessed, the accessed SRAM is powered on and the bitmap in the power control unit 123 is updated. When context switching occurs, the updated bitmap is rewritten to (updated in) the CAM 122 so as to prepare for the next execution of the process.

In contrast, if it is determined in step S1 that the context ID is not registered in the CAM 122 (if the determination in step S1 is NO), the internal control unit 121 reserves (allocates) an entry for the context ID in the CAM 122 (step S7).

Then, the power control circuit 12 starts confirmation of an access pattern of the SRAMs 111 for the process (step S3).

The power control circuit 12 performs the processing of steps S1 to S7 until context switching occurs.

Figure 6:
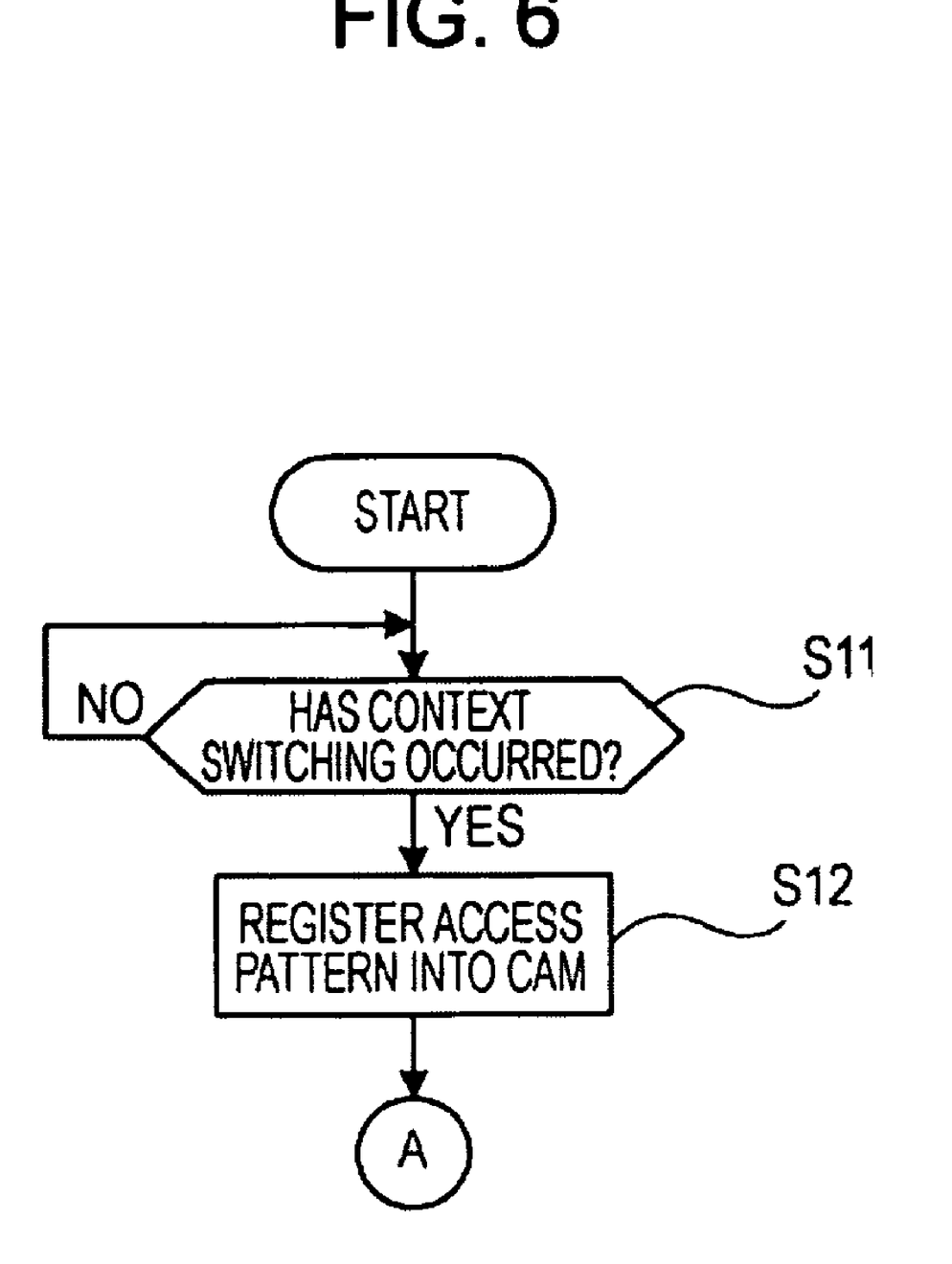
FIG. 6 is a flowchart showing another operation to be performed by the power control circuit.

FIG. 6 is a flowchart showing another operation to be performed by the power control circuit 12.

Concurrently with the operation shown in FIG. 5, the internal control unit 121 determines whether context switching has occurred (step S11).

If it is determined in step S11 that context switching has occurred (if the determination in step S11 is YES), the internal control unit 121 transmits a control signal to the power control unit 123. Thus, at the termination of the process (before occurrence of context switching), an access pattern denoting SRAMs 111 used last time (in the immediate past) is registered (overwritten) in the CAM 122 (step S12).

Then, the power control circuit 12 proceeds to step S1 to continue the processing subsequent to step S1 in accordance with a new context ID.

Figure 7:
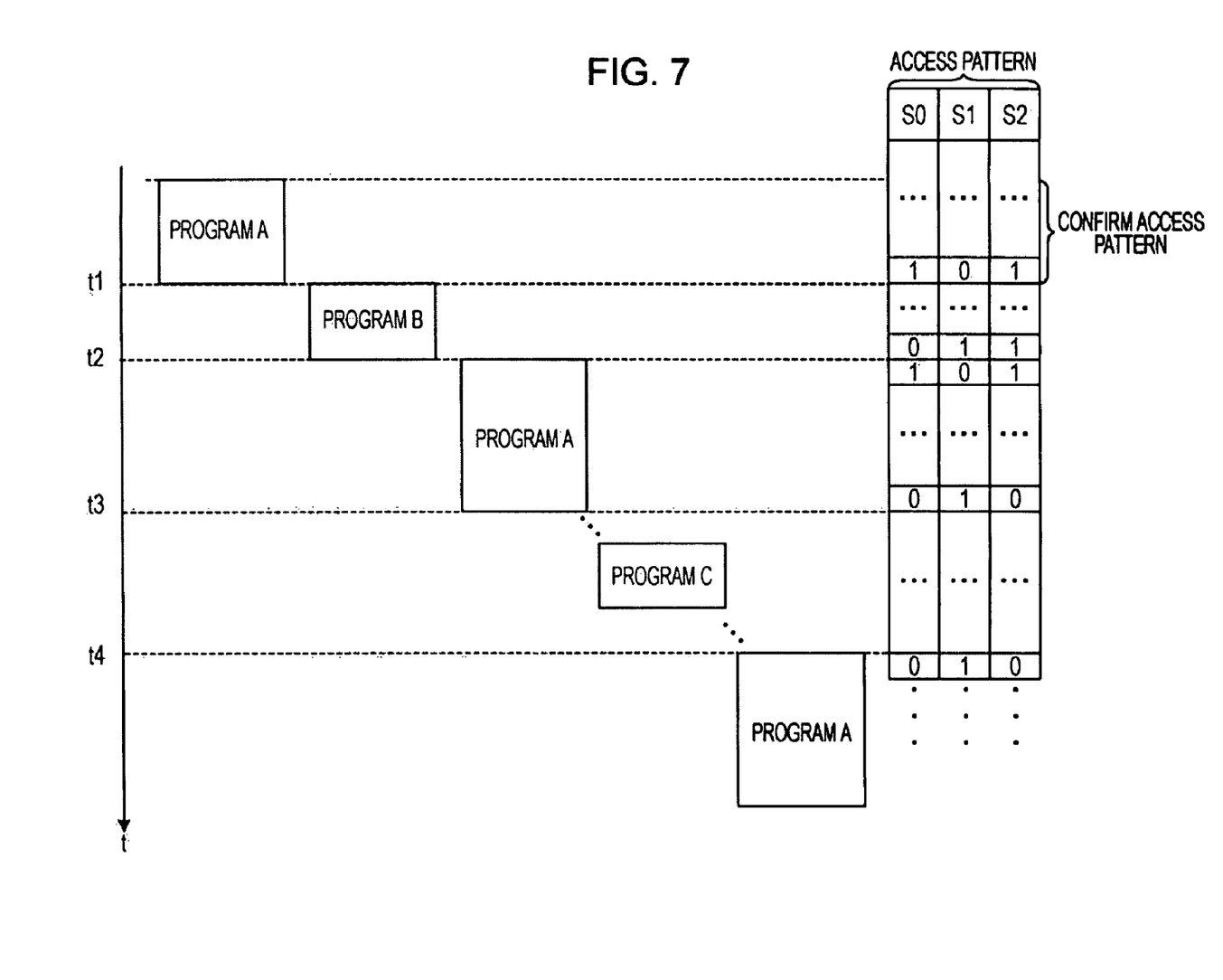
FIG. 7 is an illustration showing a specific example of an operation to be performed by the power control circuit.

FIG. 7 is an illustration showing a specific example of an operation to be performed by the power control circuit 12. For the simplicity of the description, an example in which a bitmap contains three bits will be described.

First, program A starts. Since a context ID corresponding to the program A does not exist in the CAM 122, an entry for the program A is reserved in the CAM 122, and the internal control unit 121 starts confirmation of an access pattern.

An access pattern (S0, S1, S2) of the SRAMs 111 at the point in time (time t1) when the program A is switched to program B is [101]. Thus, the context ID of the program A is registered in association with the bitmap [101] in the CAM 122.

Then, the program B starts. An access pattern (S0, S1, S2) at the point in time (time t2) when the program B is switched to the program A is [011]. Thus, the context ID of the program B is registered in association with the bitmap [011] in the CAM 122.

Then, the program A starts again. Since the context ID for the last termination of the program A exists in the CAM 122, each of the SRAMs 111 is powered on or off on the basis of the bitmap [101], which is associated with the context ID, and control starts. Then, since an access pattern (S0, S1, S2) at the point in time (time t3) when the program A is switched to program C is [010], the context ID of the program A is registered (updated) in association with the bitmap [010] in the CAM 122.

After the program C starts and ends, when the program A starts again (time t4), if the context ID for the last termination of the program A exists in the CAM 122, each of the SRAMs 111 is powered on or off on the basis of the bitmap [010], which is associated with the context ID, and control starts.

Since temporal locality and spatial locality exist in an address space used by a program, temporal locality and spatial locality also exist in the SRAMs 111 used by program access. The SRAM system 10 according to the first embodiment exploits such localities. In a situation in which a plurality of processes are performed while simultaneously switching between the plurality of processes, a bitmap denoting SRAMs 111 used in a certain process is stored in the CAM 122. Thus, when the certain process is switched to a new process at the time of context switching, SRAMs 111 to be used in an operation of the new process are powered on in advance on the basis of a presumption that the SRAMs 111 that were accessed at the last termination of the process will be used again. Thus, the SRAMs 111 can be made operable quickly without requiring cycle penalty, and the delay (latency) in the execution of a program can be reduced. Furthermore, even in a case where access to an SRAM that has not been accessed is made in the execution of a program, a bitmap corresponding to the access can be stored and the contents of the CAM 122 can be updated at the process switching. Thus, transition of a program status can be followed, and fine control for reducing power consumption can be achieved.

In addition, since the power supply is controlled in units of processes, power consumption can be actively reduced.

In addition, since the power supply of an SRAM 111 that is not being used is in a standby state, the power consumption can be further reduced.

The configuration of the CAM 122 is simpler than that of a CAM used in the related art. Thus, compared with a normal SRAM system in which a power control circuit is provided for each SRAM or each SRAM entry, the size of the system can be reduced, and power consumption can thus be reduced.

Since a single SRAM is represented by a single power-control bit and power supply to the SRAMs 111 is controlled on the basis of a bitmap used for power control in this embodiment, fine control for power supply to each SRAM can be achieved.

A case where SRAMs 111 that are constantly accessed due to the configuration thereof exist in a certain portion can be handled by acquiring an external power control signal. Thus, the waste caused by stopping power supply can be avoided.

In addition, even in a case where a plurality of processes are executed in an environment, such as multi-thread processing or simultaneous multithreading (SMT), since a context ID of each process can be distinguished from other context IDs (each process has its unique context ID), SRAM power management can be effectively achieved. Namely, even in an environment in which process A and process B are concurrently executed, power supply can be controlled for each process on the basis of a context ID and a bitmap in a corresponding entry. That is, even in a case where this technology is applied to, for example, a processor system having a plurality of processor cores or a processor having an SMT function of being capable of executing a plurality of threads, which is available today, there is no need to provide a power control circuit for each processor core or each SMT core. Thus, compared with the related art, the circuit scale can be significantly reduced.

Needless to say, the greater the number of entries in the CAM 122, the greater the hit rate in the CAM 122 in step S1 of FIG. 5. Thus, the possibility of being capable of powering on an SRAM 111 in advance becomes higher. However, the greater the number of entries in the CAM 122, the greater the power consumption of the CAM 122. Thus, it is desirable that the number of entries in the CAM 122 is determined in consideration of an actual system configuration, such as the average maximum number of processes that can be executed by a processor. However, even in a case where the number of entries in the CAM 122 is large, the size of the system can be reduced compared with a configuration of the related art in which a power control circuit is provided for each cache tag entry of a tag memory in a cache SRAM.

An SRAM system according to a second embodiment of the present invention will be described.

Differences between the SRAM system according to the second embodiment and the SRAM system according to the first embodiment will be mainly described. The description of similar points will be omitted.

Figure 8:
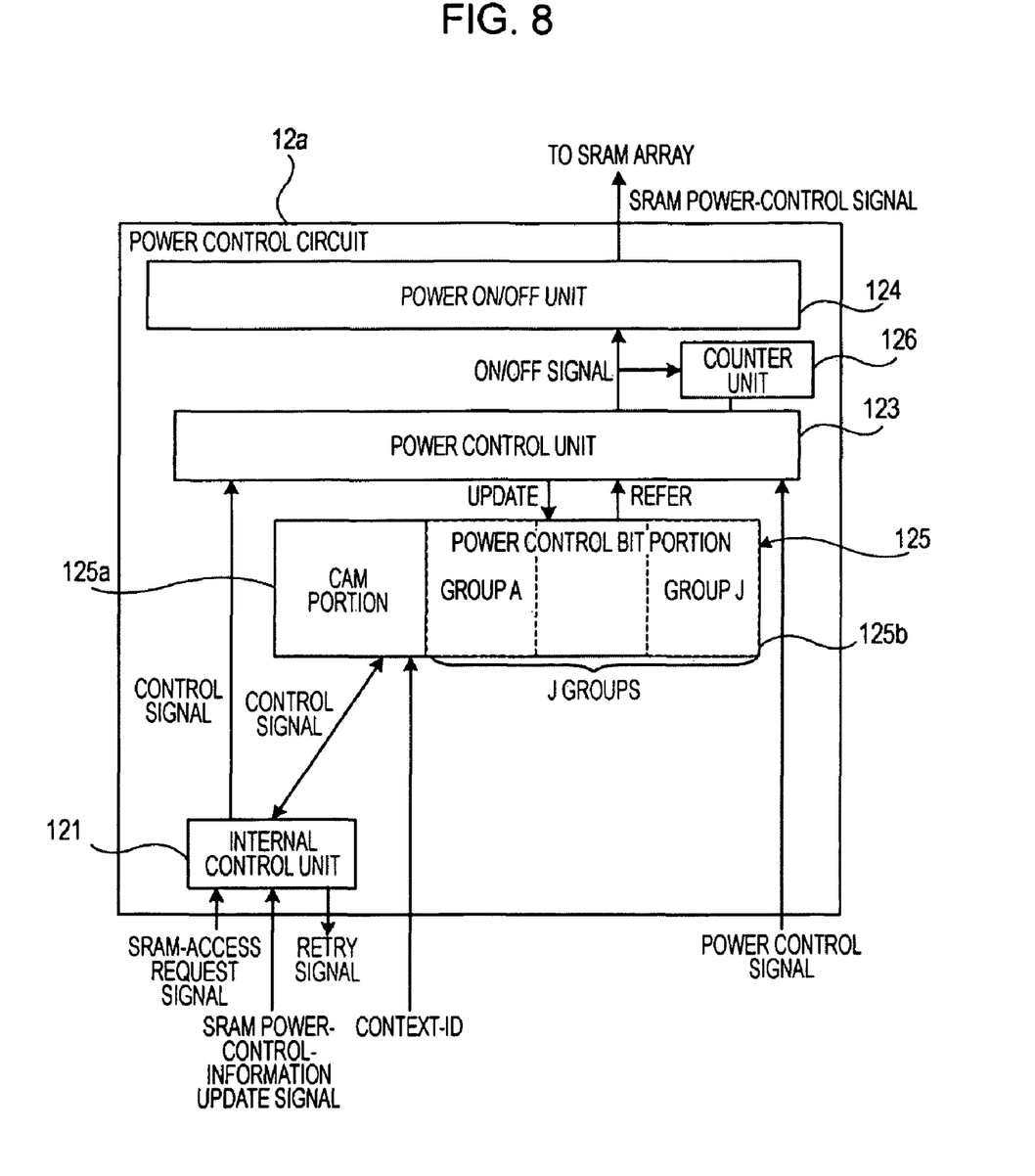
FIG. 8 is a block diagram showing a power control circuit used in a second embodiment.

The SRAM system according to the second embodiment is different from the SRAM system according to the first embodiment in that the SRAMs 111 are grouped into a plurality of groups, the use frequency of each of the SRAMs 111 in a corresponding group is analyzed, and power control is performed for a group including an SRAM whose use frequency is equal to or more than a predetermined value.

FIG. 8 is a block diagram showing a power control circuit 12a used in the second embodiment.

The power control circuit 12a includes a CAM 125, instead of the CAM 122. The power control circuit 12a also includes a counter unit 126.

The CAM 125 includes a CAM portion 125a having the same function as the CAM portion 122a and a power control bit portion 125b including J groups.

Figure 9:
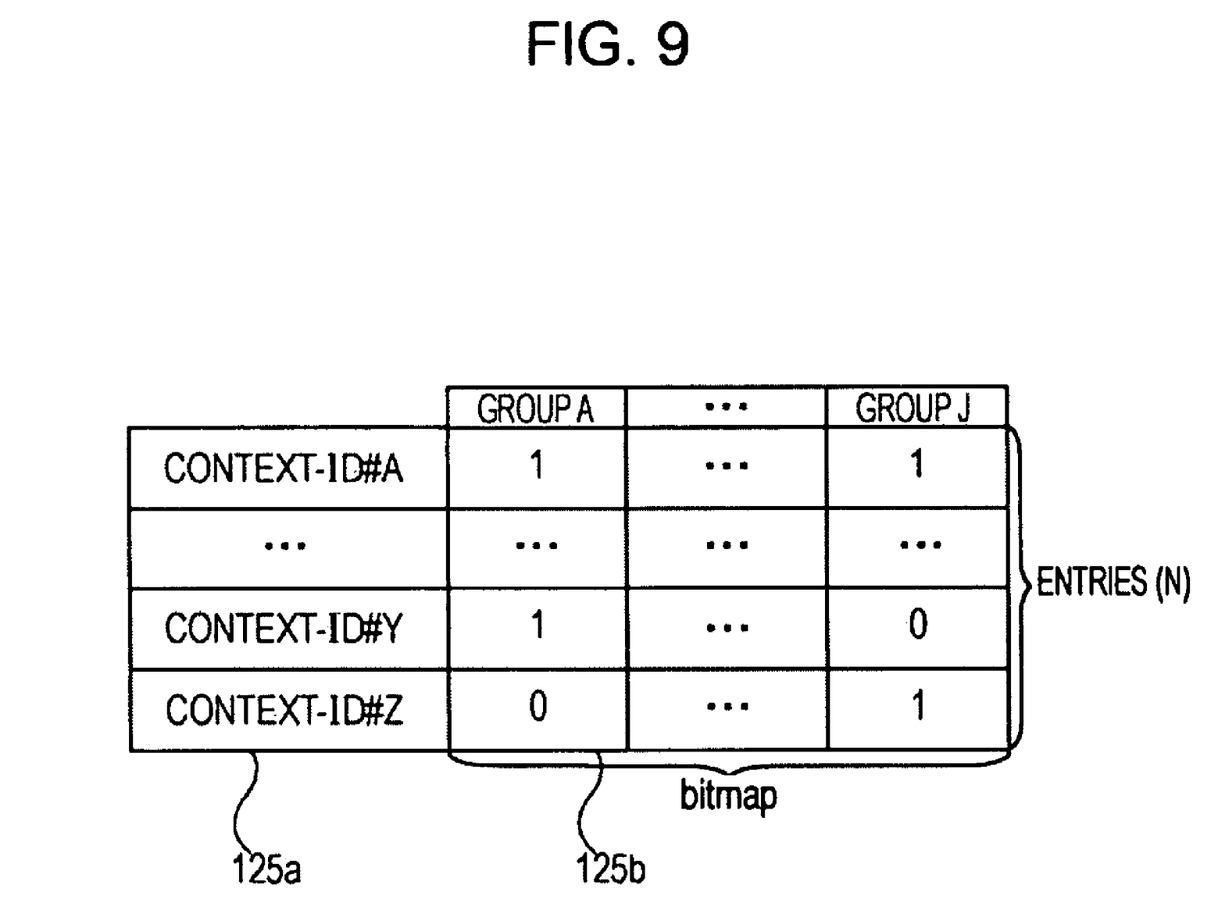
FIG. 9 shows the configuration of a CAM used in the second embodiment.

FIG. 9 shows the configuration of the CAM 125 used in the second embodiment.

For each of a plurality of groups (group A, ..., and group J) provided in the power control bit portion 125b, i SRAMs 111 (i=1, 2, ..., M−1) are allocated. All the SRAMs 111 in the SRAM array 11 are allocated for corresponding groups. A method for allocating an SRAM 111 for a corresponding group is not particularly specified. However, for example, it is desirable that an SRAM 111 be allocated for a group according to the use frequency of the SRAM 111. Accordingly, more efficient power control can be achieved.

Figure 10:
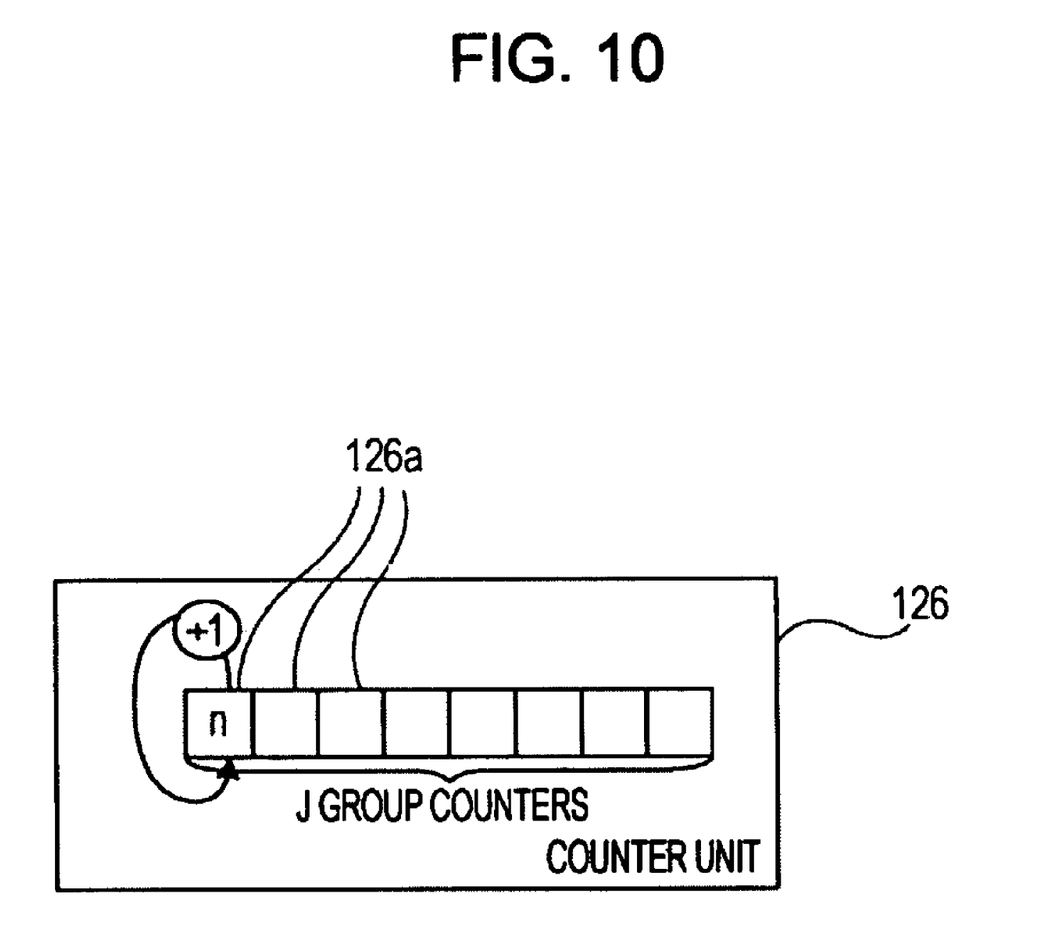
FIG. 10 is an illustration showing a function of a counter unit.

FIG. 10 is an illustration showing a function of the counter unit 126.

The counter unit 126 includes j group counters 126a. Each group provided in the power control bit portion 125b is allocated for a corresponding group counter 126a.

The counter unit 126 monitors an ON/OFF signal, and counts or resets each of the group counters 126a in accordance with the ON/OFF signal.

An operation of the power control circuit 12a used in the second embodiment will be described.

In a certain process, every time each SRAM 111 in a group (in the second embodiment, one of the SRAMs 111 in a group) is changed from a standby state to a powered-on state, the counter unit 126 increments the group counter 126a for the SRAM 111 by one. Then, at the time of context switching, for a group whose group counter 126a exhibits a predetermined value or more, that is, for a group having an SRAM 111 that is powered on a predetermined number of times or more, a bitmap is written to the power control bit portion 125b through the power control unit 123 such that the bitmap is set to "1". Thus, at the next start of the process, all the SRAMs 111 allocated for the group are powered on. In contrast, for a group whose group counter 126a exhibits a value less than the predetermined value, that is, for a group having an SRAM 111 that is powered on the number of times less than the predetermined number of times, the bitmap is set to "0".

When context switching occurs, the counter unit 126 resets the value of each of the counters to 0 so as to prepare for the execution of the next process.

The SRAM system according to the second embodiment is capable of achieving advantages similar to those of the SRAM system according to the first embodiment.

Since the SRAM system according to the second embodiment constantly supplies power to an SRAM that is determined to be frequently used in a process, more efficient control can be achieved.

Although SRAM systems and control methods for the SRAM systems have been described with reference to the drawings, the present invention is not limited to the foregoing embodiments. The configuration of components can be replaced with another configuration having a similar function. In addition, other components or steps may be added to the present invention.

In addition, two or more configurations (features) of the foregoing embodiments may be combined together.

Normally, a context ID is often represented using an upper address space and contains at most about 16 to 32 bits. In addition, a cache line normally corresponds to a plurality of SRAMs. Thus, for example, even in a case where 192 SRAMs are provided, when a cache line contains 8 bytes, 24 cache lines are used. Thus, 24 bits are sufficient for power control. Consequently, a CAM having a capacity of about 40 to 56 bits is sufficient. As described above, a CAM with the number of bits that is smaller than a case where a counter is provided for each TAG SRAM can be achieved.

What is claimed is:

1. A static random access memory system used within a microprocessor, comprising:
   a static random access memory array including a plurality of static random access memories;
   a storage unit configured to store a context ID used in the execution of a program or a process in association with an access pattern of the plurality of static random access memories in the execution of the program or the process;
   a search unit configured to, every time context switching occurs, search the storage unit for an access pattern that is associated with a context ID corresponding to a context ID of a program or a process to be executed after the context switching; and
   a power control unit configured to cause a static random access memory to be readable and writable on the basis of the access pattern of the plurality of static random access memories found by the search unit,
   wherein the access pattern of the plurality of static random access memories is a pattern denoting the plurality of static random access memories being powered on or powered off when the context switching occurs, and when the search unit does not find an access pattern associated with a context ID corresponding to a context ID of a program or a process to be executed after the context switching, an entry for such an access pattern is reserved in the storage unit.

2. The static random access memory system used within a microprocessor according to claim 1, further comprising:
   a detection unit configured to detect the access pattern of the plurality of static random access memories in the execution of the program or the process,
   wherein the storage unit stores the context ID used in the execution of the program or the process in association with the access pattern of the plurality of static random access memories detected by the detection unit.

3. The static random access memory system used within a microprocessor according to claim 2, wherein the power control unit also serves as the detection unit.

4. The static random access memory system used within a microprocessor according to claim 1, wherein the power control unit reduces electric power of a static random access memory that is not powered on to a level such that a value of the static random access memory can be stored on the basis of the access pattern of the plurality of static random access memories found by the search unit.

5. The static random access memory system used within a microprocessor according to claim 1, wherein when receiving an external power control signal for causing a static random access memory to be readable and writable in advance, the power control unit causes the static random access memory designated by the external power control signal to be readable and writable instead of the access pattern of the plurality of static random access memories.

6. A static random access memory system used within a microprocessor, comprising:
   a static random access memory array including a plurality of static random access memories;
   a storage unit configured to store a context ID used in the execution of a program or a process in association with an access pattern of the plurality of static random access memories in the execution of the program or the process;
   a search unit configured to, every time context switching occurs, search the storage unit for an access pattern that is associated with a context ID corresponding to a context ID of a program or a process to be executed after the context switching; and
   a power control unit configured to cause a static random access memory to be readable and writable on the basis of the access pattern of the plurality of static random access memories found by the search unit,
   wherein the storage unit stores, as the access pattern of the plurality of static random access memories, a bit pattern of each of a plurality of groups each including a predetermined number of static random access memories, and when the search unit does not find an access pattern associated with a context ID corresponding to a context ID of a program or a process to be executed after the context switching, an entry for such an access pattern is reserved in the storage unit.

7. The static random access memory system used within a microprocessor according to claim 6, further comprising:
   a counter unit including a counter for grouping the plurality of static random access memories into the plurality of groups each including the predetermined number of static random access memories and for measuring the use frequency of the predetermined number of static random access memories in each of the plurality of groups, the counter unit storing, in the execution of the program or the process, the bit pattern in the storage unit such that a group in which the use frequency is equal to or more than a predetermined value and a group in which the use frequency is less than the predetermined value are distinguished from each other.

8. A control method for a static random access memory system used within a microprocessor, comprising:
   a search step of searching, every time switching of a context used in the execution of a program or a process occurs, a storage unit, which is configured to store an access pattern of a plurality of static random access memories forming a static random access memory array in association with a context ID, for an access pattern that is associated with a context ID corresponding to a context ID of a program or a process to be executed after the context switching; and
   a control step of causing a static random access memory to be readable and writable on the basis of the access pattern of the plurality of static random access memories found in the search step,
   wherein if, during the search step, an access pattern associated with a context ID corresponding to a context ID of a program or a process to be executed after the context switching is not found in the storage unit, an entry for such an access pattern is reserved in the storage unit.

9. The control method according to claim 8, wherein the access pattern of the plurality of static random access memories is a pattern denoting the plurality of static random access memories being powered on or powered off when the context switching occurs.

10. The control method according to claim 8, further comprising:
    a detection step of detecting an access pattern of the plurality of static random access memories in the execution of the program or the process,
    wherein the storage unit stores a context ID used in the execution of the program or the process in association with the access pattern of the plurality of static random access memories detected in the detection step.

11. The control method according to claim 10, wherein the access pattern of the plurality of static random access memories detected in the detection step is a pattern denoting the plurality of static random access memories being powered on or powered off when the context switching occurs.

12. The control method according to claim 8, further comprising:

a reducing step of reducing electric power of a static random access memory that is not powered on to a level such that a value of the static random access memory can be stored on the basis of the access pattern of the plurality of static random access memories found in the search step.

13. The control method according to claim 8, wherein in the control step, when an external power control signal for causing a static random access memory to be readable and writable in advance is received, the static random access memory designated by the external power control signal becomes readable and writable instead of the access pattern of the plurality of static random access memories.

14. The control method according to claim 8, wherein the storage unit stores, as the access pattern of the plurality of static random access memories, an ON/OFF pattern of the plurality of static random access memories.

15. The control method according to claim 8, wherein the storage unit stores, as the access pattern of the plurality of static random access memories, a bit pattern of each of a plurality of groups each including a predetermined number of static random access memories.

16. The control method according to claim 8, wherein after the entry for an access pattern not found is reserved in the storage unit, and after the program or process associated with said not found access pattern is completed, the associated access pattern is stored in the reserved entry of the storage unit.

17. The static random access memory system used within a microprocessor according to claim 8, wherein after the entry for an access pattern not found is reserved in the storage unit, and after the program or process associated with said not found access pattern is completed, the associated access pattern is stored in the reserved entry of the storage unit.

18. The static random access memory system used within a microprocessor according to claim 6, wherein after the entry for an access pattern not found is reserved in the storage unit, and after the program or process associated with said not found access pattern is completed, the associated access pattern is stored in the reserved entry of the storage unit.

* * * * *